US006580027B2

(12) United States Patent
Forrest et al.

(10) Patent No.: US 6,580,027 B2
(45) Date of Patent: Jun. 17, 2003

(54) SOLAR CELLS USING FULLERENES

(75) Inventors: Stephen R. Forrest, Princeton, NJ (US); Peter Peumans, Princeton, NJ (US)

(73) Assignee: Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/878,523

(22) Filed: Jun. 11, 2001

(65) Prior Publication Data

US 2002/0189666 A1 Dec. 19, 2002

(51) Int. Cl.[7] ................. H01L 31/0256; H01L 31/04
(52) U.S. Cl. ............... 136/263; 136/256; 136/252; 136/249; 136/255; 136/246; 136/259; 257/40; 257/461; 257/436; 257/431; 250/214.1; 438/82; 438/94; 438/65
(58) Field of Search ............... 136/263, 256, 136/252, 249, 255, 246, 259; 257/40, 461, 436, 431; 250/214.1; 438/82, 94, 65

(56) References Cited

U.S. PATENT DOCUMENTS

| | | | | |
|---|---|---|---|---|
| 5,454,880 A | * | 10/1995 | Sariciftci et al. | 136/263 |
| 5,698,048 A | * | 12/1997 | Friend et al. | 136/263 |
| 5,703,436 A | | 12/1997 | Forrest et al. | |
| 5,861,219 A | | 1/1999 | Thompson et al. | |
| 5,986,206 A | * | 11/1999 | Kambe et al. | 136/263 |
| 6,097,147 A | | 8/2000 | Baldo et al. | |
| 6,198,091 B1 | | 3/2001 | Forrest et al. | |
| 6,198,092 B1 | | 3/2001 | Bulovic et al. | |
| 6,278,055 B1 | | 8/2001 | Forrest et al. | |
| 6,297,495 B1 | * | 10/2001 | Bulovic et al. | 250/214.1 |
| 6,333,458 B1 | * | 12/2001 | Forrest et al. | 136/259 |
| 6,352,777 B1 | * | 3/2002 | Bulovic et al. | 428/411.1 |
| 6,451,415 B1 | * | 9/2002 | Forrest et al. | 428/212 |

FOREIGN PATENT DOCUMENTS

| | | | |
|---|---|---|---|
| JP | 9-74216 A | * | 3/1997 |
| WO | WO-00/11725 A1 | * | 3/2000 |

OTHER PUBLICATIONS

Pettersson et al, "Modeling photocurrent action spectra of photovoltaic devices based on organic thin films," Journal of Applied Physics, vol. 86, No. 1. pp. 487–496, Jul. 1, 1999.*
Forrest et al., U.S. patent application Ser. No. 09/136,342, "Organic Photosensitive Optoelectronic Devices With Transparent Electrodes", filed Aug. 19, 1998.
Forrest et al., U.S. patent application Ser. No. 09/449,800, "Highly Efficient Multiple Reflection Photosensitive Optoelectronic Device With Optical Concentrator", filed Nov. 26, 1999.
Forrest et al., U.S. patent application Ser. No. 09/449,801, "Organic Photosensitive Optoelectronic Device With an Exciton Blocking Layer", filed Nov. 26, 1999.
Parthasarathy et al., U.S. patent application Ser. No. 09/054,707, "Highly Transparent Non–Metallic Cathodes", filed Apr. 3, 1998.

(List continued on next page.)

Primary Examiner—Alan Diamond
(74) Attorney, Agent, or Firm—Kenyon & Kenyon

(57) ABSTRACT

Organic photosensitive optoelectronic devices are disclosed. The devises comprise photoconductive organic thin films in a heterostructure, which include an exciton blocking layer to enhance device efficiency. The use of fullerenes in the electron conducting layer has lead to devices with high efficiency. Single heterostructure, stacked and wave-guide type embodiments are disclosed. Devices having multilayer structures and an exciton blocking layer are also disclosed. Guidelines for selection of exciton blocking layers are provided.

19 Claims, 5 Drawing Sheets

OTHER PUBLICATIONS

Peumans et al "Efficient photon harvesting at high optical intestines in ultrathin organic double–heterstructure photovoltaic diodes", *Applied Physics Letters*, vol. 76, No. 19, pp. 2650–52, May 8, 2000.

T.M. Brown et al, "Built–in field electroabsorption spectroscopy of polymer light–emitting diodes incorporating a doped poly(3,4–ethylene doixythiophene) hole injection layer", *Appl. Phys. Lett.*, vol. 75, No. 12, pp. 1679–1681, Sep. 20, 1999.

R. Mitsumoto et al. "Electronic Structures and Chemical Bonding of Fluorinated Fullerenes Studied by NEXAAFS, UPS and Vacuum–UV Absorption Spectroscopies", *J. Phys. Chem. A*, vol. 102, No. 3, pp. 552–560 (1998).

I.G. Hill et al., "Organic semiconductor heterointerfaces containing bathocuproine", *J. Appl. Phys.*, vol. 86, No. 8, pp. 4515–4519, Oct. 15, 1999.

L.A.A. Petterson et al., "Modeling photocurrent action spectra of photovoltaic devices based on organic thin films", *J. Appl. Phys.*, vol. 86, No. 1, pp. 487–496, Jul. 1, 1999.

W.T. Welford and R. Winston, *High Collection Nonimaging Optics*, pp. 172–179, Academic Press, 1989.

W. Tang, "Two layer organic photovoltaic cell", *Appl. Phys. Lett.* 48(2),pp. 183–185 (Jan. 13, 1986).

J.J.M. Halls, et al., "Efficient photodiodes from interpenetrating polymer networks", *Nature* 376, pp. 498–500 (Aug. 10, 1995).

M. Granstrom, et al., "Laminated fabrication of polymeric photovoltaic diodes", *Nature* 395, pp. 257–260 (Sep. 17, 1998).

G. Yu, et al., "Polymer photovoltaic Cells: Enhanced efficiencies via a network of internal donor–acceptor heterojunctions" *Science* 270,pp. 1789–1791 (Dec. 15, 1995).

J.H. Schon et al., "Efficient organic photovoltaic diodes based on doped pentacene", *Nature* 403, pp. 408–410 (Jan. 27, 2000).

J.H. Schon, et al., "Efficient photovoltaic energy conversion in pentacene–based heterjunctions", *Appl. Phys. Lett.* 77, pp. 2473–2475 (Oct. 16, 2000).

S.E. Shaheen, et al., "2.5% efficient organic plastic solar cells", *Appl. Phys. Lett.* 78, pp. 841–843 (Feb. 5, 2001).

P.E. Burrows, Z. Shen, V. Bulovic, D.M. McCarty, S.R. Forrest, J.A. Cronin, and M.E. Thompson,*J. Appl. Phys.* 79, 7991 (1996).

S.R. Forrest, "Ultrathin Organic Films Grown by Organic Molecular Beam Deposition and Related Techniques", *Chem. Rev.* 97, No. 6, pp. 1793–1896 (Sep./Oct. 1997).

Y. Hirose, et al., "Chemistry and electronic properties of metal–organic semiconductor interfaces: L, Ti, In, Sn, Ag, and Au on PTCDA", *Phys. Rev. B.* 54, pp. 13 748–13 758 (Nov. 15, 1996).

G. Parthasarathy, P.E. Burrows, V. Khalfin, V.G. Kozlov, and S.R. Forrest, *Appl. Phys. Lett.* 72, 2138 (1998).

\* cited by examiner

SOLAR CELLS USING FULLERENES

FIELD OF INVENTION

The present invention generally relates to organic photosensitive optoelectronic devices. More specifically, it is directed to organic photovoltaic devices, e.g., organic solar cells.

BACKGROUND OF THE INVENTION

Optoelectronic devices rely on the optical and electronic properties of materials to either produce or detect electromagnetic radiation or to generate electricity from ambient electromagnetic radiation. Photosensitive optoelectronic devices convert electromagnetic radiation into electricity. Solar cells, also known as photovoltaic (PV) devices, are used to generate electrical power from ambient light. PV devices are used to drive power consuming loads to provide, for example, lighting, heating, or to operate electronic equipment such as computers or remote monitoring or communications equipment. These power generation applications often involve the charging of batteries or other energy storage devices so that equipment operation may continue when direct illumination from the sun or other ambient light sources is not available. As used herein, the term "resistive load" refers to any power consuming or storing device, equipment or system.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation of selected spectral energies to generate electric charge carriers.

Solar cells are characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices produce a photogenerated voltage when they are connected across a load and are irradiated by light. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have values, $I_{max}$ and $V_{max}$, respectively.

A figure of merit for solar cells is the fill factor, ff, defined as:

$$ff = \frac{I_{max}V_{max}}{I_{SC}V_{OC}} \qquad (1)$$

where ff is always less than 1, as $I_{SC}$ and $V_{OC}$ are never obtained simultaneously in actual use. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0+h\nu \rightarrow S_0^*$. Here $S_0$ and $S_0^*$ denote ground and excited molecular states, respectively. This energy absorption is associated with the promotion of an electron from a bound state in the HOMO, which may be a π-bond, to the LUMO, which may be a π*-bond, or equivalently, the promotion of a hole from the LUMO to the HOMO. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair must become separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n, or donor, type or p, or acceptor, type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photogenerated, majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor, or n-type, character for PTCDA, experiments indicate that hole mobilities exceed electron mobilities by several orders of magnitude so that the hole mobility is a critical factor. The result is that device configuration predictions from donor/acceptor criteria may not be borne out by actual device performance. Due to these unique electronic properties of organic materials, rather than designating them as "p-type" or "acceptor-type" and "n-type" or "donor-type", the nomenclature of "hole-transporting-layer" (HTL) or "electron-transporting-layer" (ETL) is frequently used. In this designation scheme, an ETL will be preferentially electron conducting and an HTL will be preferentially hole transporting.

A typical prior art photovoltaic device configuration is the organic bilayer cell. In the bilayer cell, charge separation predominantly occurs at the organic heterojunction. The built-in potential is determined by the HOMO-LUMO energy difference between the two materials contacting to form the heterojunction. The HOMO-LUMO gap offset between the HTL and ETL produce an electric field around the HTL/ETL interface.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process, that is, carrier generation requires exciton generation, diffusion and ionization. However, the diffusion length ($L_D$) of an exciton is typically much less ($L_D \sim 50$ Å) than the optical absorption length (~500 Å), requiring a trade off between using a thick, and therefore resistive, cell with multiple or highly folded interfaces, or a thin cell with a low optical absorption efficiency. To date none of these proposals has led to a significant improvement in overall cell performance, particularly at high illumination intensities. In order to increase the cell performance, materials and device configurations are desirable which can enhance the quantum yield and, therefore, the power conversion efficiency.

We have now achieved high power conversion efficiency in an organic PV device composed of thin organic films. According to the present invention, improved materials choice and device processing techniques allow for the construction of organic PV cells with power conversion efficiencies in excess of 4%.

SUMMARY AND OBJECTS OF INVENTION

The present invention provides organic-based solar cells with greatly improved efficiency. These PV devices comprise an anode layer, an organic hole transporting (donor-type) layer, an electron transporting (acceptor-type) layer comprising a fullerene, and a cathode. Advantageously, the device also includes one or more exciton blocking layers (EBL) between the ETL and the cathode and/or between the anode and the HTL.

It is an object of the present invention to provide an organic PV device with improved photovoltaic performance. To this end, the invention provides an organic PV device capable of operating with a high external quantum efficiency.

Another object of the present invention is to provide organic photosensitive optoelectronic devices with improved absorption of incident radiation for more efficient photogeneration of charge carriers.

It is a further objective of the present invention to provide organic photosensitive optoelectronic devices with an improved $V_{OC}$ and an improved $I_{SC}$.

A further object of the present invention is to provide a stacked organic photosensitive optoelectronic devices comprised of multiple subcells with transparent electrodes and having a substantially reflective bottom layer to increase overall electromagnetic radiation absorption by capturing the electromagnetic radiation reflected by the bottom layer.

BRIEF DESCRIPTION OF THE DRAWINGS

The foregoing and other features of the present invention will be more readily apparent from the following detailed description of exemplary embodiments taken in conjunction with the attached drawings.

BCP/800 Å Al, where the anode is either ITO (cell A, squares), or ITO/PEDOT:PSS (cell B, circles). The open symbols represent I–V curves taken in the dark, while the filled symbols represent I–V curves taken under AM1.5G illumination with an intensity of 100 mW/cm$^2$. The lower panel shows the plot of photocurrent density vs. voltage for the same devices (cell A: crossed squares, cell B: crossed circles). The photocurrent is the difference between the I–V curves taken in the dark and under illumination. Also shown is the photocurrent of cell A shifted by DV=+0.50V (cell A*, dashed line), which overlaps with the photocurrent curve of cell B.

Figure 3:
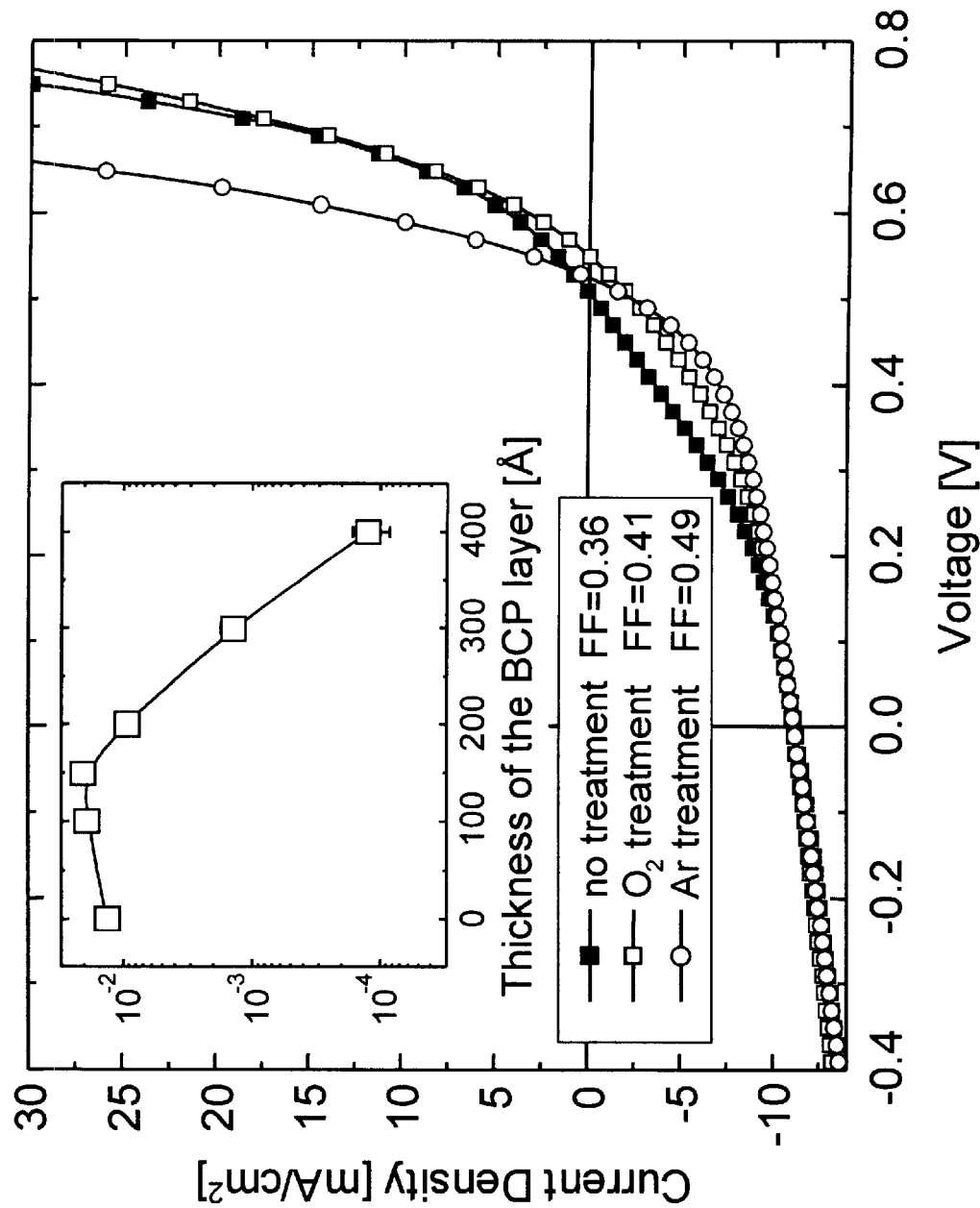

FIG. 3 shows the current-voltage characteristics of ITO/PEDOT:PSS/50 Å CuPc/200 Å $C_{60}$/100 Å BCP/800 Å Al devices under AM1.5G illumination of 100 mW/cm$_2$. The PEDOT:PSS film was either untreated (filled squares), treated with an oxygen plasma (10W, 100 mTorr, 30 s: open squares), or treated with an Ar plasma (10W, 100 mTorr, 30 s: open circles). The inset shows the short circuit current of ITO/PEDOT:PSS/200 Å CuPc/400 Å $C_{60}$/BCP/800 Å Al devices under AM1.5G illumination with an intensity of 100 mW/cm$^2$, as a function of the thickness of the BCP layer. The smooth curve through the data points (open squares) is a guide to the eye.

Figure 4:
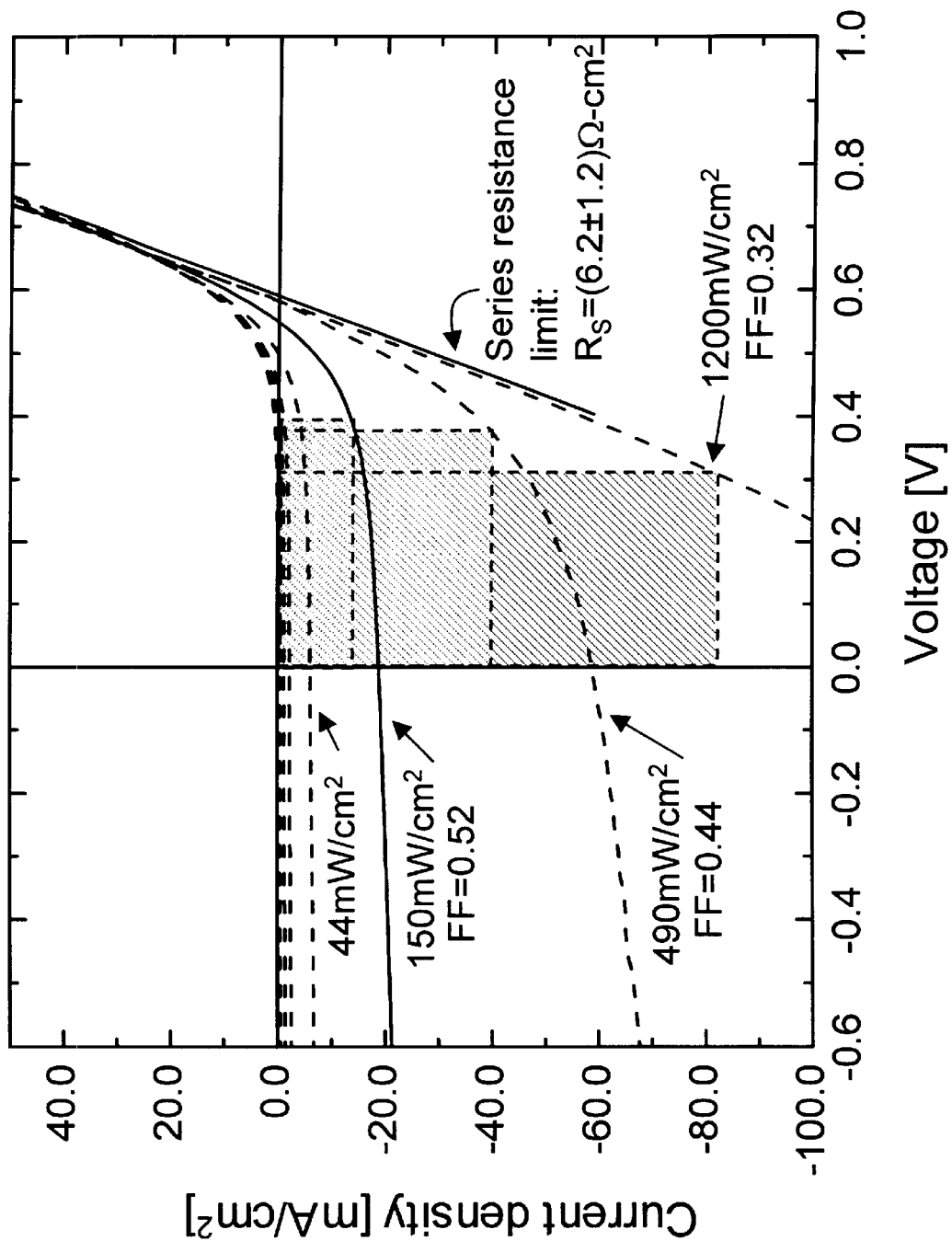

FIG. 4 shows the current-voltage characteristics of the optimized device structure: ITO/PEDOT:PSS(Ar treated)/200 Å CuPc/400 Å $C_{60}$/120 Å BCP/1000 Å Al under AM1.5G illumination of variable intensity. The maximum power output is indicated for illumination intensities of >150 mW/cm$^2$, illustrating the effect of the series resistance on the ff.

Figure 5:
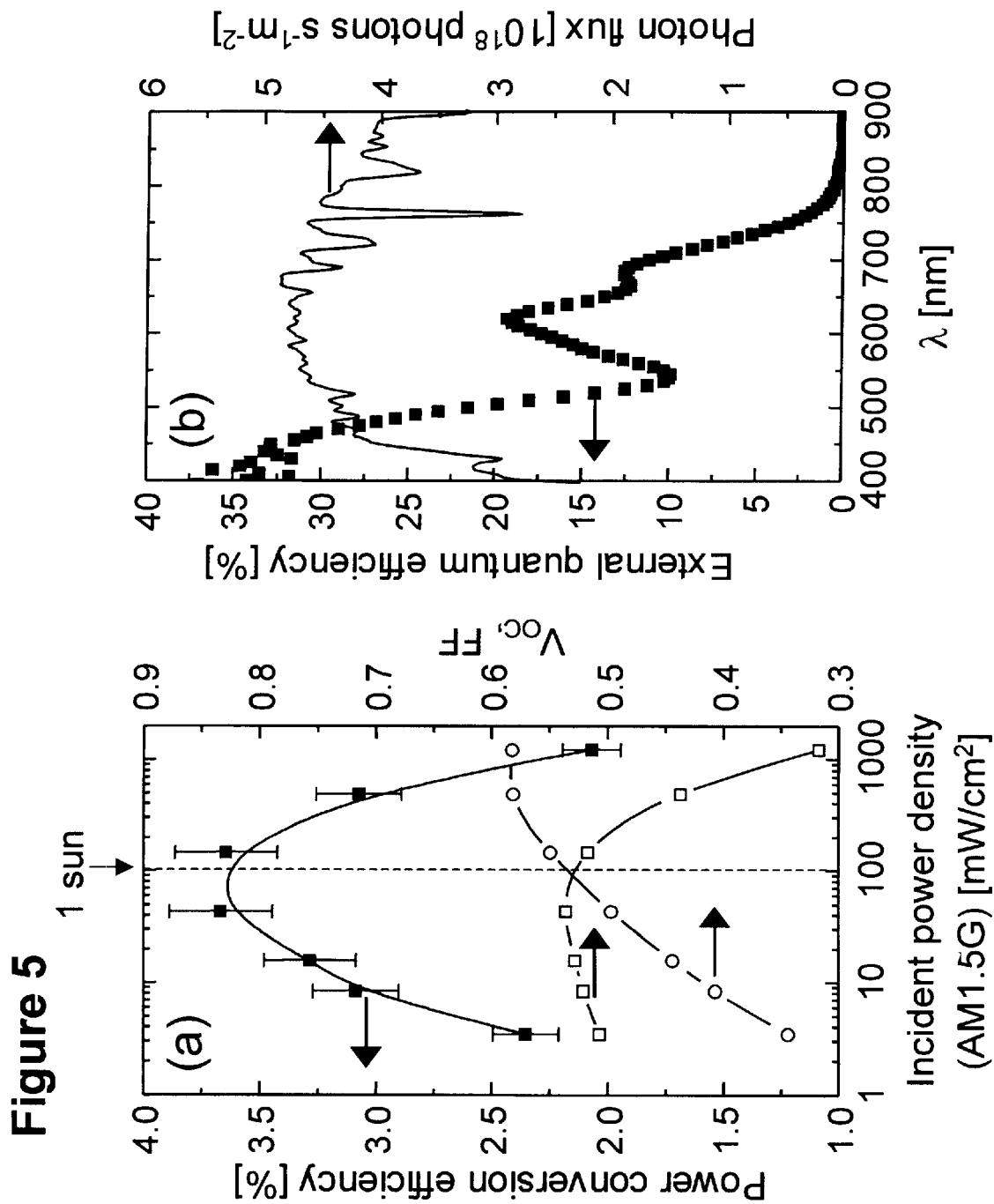

FIG. 5($a$) shows the $\eta_P$, ff and $V_{OC}$ of the optimized device with layer structure: ITO/PEDOT:PSS(Ar treated)/200 Å CuPc/400 Å $C_{60}$/120 Å BCP/1000 Å Al as a function of the incident optical power.

FIG. 5($b$) shows the external quantum efficiency of the same device as a function of wavelength. The photon flux corresponding to an AM1.5G solar spectrum is also shown for comparison.

DETAILED DESCRIPTION

The invention provides organic PV devices with increased efficiency comprising an anode layer, a hole transporting (donor-type) layer, an electron transporting (acceptor-type) layer, and a cathode. The ETL in the devices of the present invention comprise a fullerene compound. Advantageously, the device also includes one or more exciton blocking layers (EBLs). Further, the device may also include a charge transfer layer.

The present invention provides devices incorporating an ETL comprising fullerenes, for example $C_{60}$, that show substantially improved power conversion efficiencies over previously demonstrated organic thin-film PV cells. It is believed that the improved results are primarily a consequence of the long exciton diffusion lengths of the fullerene, on the order of 77±10 Å for $C_{60}$ (L. A. A. Petterson et al., J. Appl. Phys. 86, 487 (1999)). This can be compared to the exciton diffusion length of 30±3 Å for PTCBI. In addition, electron conduction in the fullerene thin films does not lead to large voltage drops.

The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$–$C_{1000}$. Preferably, the fullerene is selected from the range of $C_{60}$ to $C_{96}$. Most preferably the fullerene is $C_{60}$ or $C_{70}$. It is also permissible to utilize chemically modified fullerenes, provided that the modified fullerene retains acceptor-type and electron mobility characteristics.

Adjacent to the ETL, is a layer of organic donor-type material, the HTL. The boundary of the ETL and the HTL forms the heterojunction which produces an internally generated electric field. A preferred material for the HTL is pthalocyanine, or a derivative or transition metal complex thereof. Copper pthalocyanine (CuPc) is a particularly preferred material for the HTL.

The electrodes, or contacts, used in a photosensitive optoelectronic device are an important consideration, as shown in co-pending application Ser. No. 09/136,342, now U.S. Pat. No. 6,352,777, incorporated herein by reference. When used herein, the terms "electrode" and "contact" refer to layers that provide a medium for delivering photogenerated power to an external circuit or providing a bias voltage to the device. That is, an electrode, or contact, provides the interface between the photoconductively active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer, where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent".

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of the photosensitive optoelectronic device, a highly transparent, non-metallic, low resistance cathode such as disclosed in U.S. patent application Ser. No. 09/054,707 to Parthasarathy et al. ("Parthasarathy '707"), now U.S. Pat. No. 6,420,031, or a highly efficient, low resistance metallic/non-metallic compound cathode such as disclosed in U.S. Pat. No. 5,703,436 to Forrest et al. ("Forrest '436"). Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode. Parthasarathy '707 discloses that an ITO layer onto which an organic layer had been deposited, instead of an organic layer onto which the ITO layer had been deposited, does not function as an efficient cathode.

Herein, the term "cathode" is used in the following manner. In a non-stacked PV device or a single unit of a stacked PV device under ambient irradiation and connected with a resistive load and with no externally applied voltage, e.g., a solar cell, electrons move to the cathode from the adjacent photoconducting material. Similarly, the term "anode" is used herein such that in a solar cell under illumination, holes move to the anode from the adjacent photoconducting material, which is equivalent to electrons moving in the opposite manner. It will be noted that as the terms are used herein, anodes and cathodes may be electrodes or charge transfer layers.

In a preferred embodiment of the invention, the stacked organic layers include one or more exciton blocking layers (EBLs) as described in U.S. Pat. No. 6,097,147, Peumans et al, *Applied Physics Letters* 2000, 76, 2650–52, and co-pending application Ser. No. 09/449,801, filed Nov. 26, 1999, now U.S. Pat. No. 6,451,415, incorporated herein by reference. Higher internal and external quantum efficiencies have been achieved by the inclusion of one or more EBLs to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL will necessarily block one sign of charge carrier. By design, an EBL will always exist between two layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO level closely matching the LUMO level of the adjacent ETL material so that any undesired barrier to electrons is minimized.

It should be appreciated that the exciton blocking nature of a material is not an intrinsic property. Whether a given material will act as an exciton blocker depends upon the relative HOMO and LUMO levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is situated between the ETL and the cathode. A preferred material for the EBL comprises 2,9-dimethyl-4,7-diphenyl-1,10-phenanthroline (also called bathocuproine or BCP), which is believed to have a LUMO-HOMO separation of about 3.5 eV, or bis(2-methyl-8-hydroxyquinolinoato)-aluminum(III)phenolate ($Alq_2OPH$). BCP is an effective exciton blocker which can easily transport electrons to the cathode from the adjoining fullerene layer.

The EBL layer may be doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

In another preferred embodiment of the invention, a planarizing layer is situated between the anode and the HTL. A preferred material for this planarizing layer comprises a film of 3,4-polyethylenedioxythiophene:polystyrenesuffonate (PEDOT:PSS). The introduction of the PEDOT:PSS layer between the anodes (ITO) and the HTL (CuPc) leads to fabrication yields of close to 100% (i.e., no shorts were observed for >50 measured devices of varying thickness). We attribute this to the ability of the spin-coated PEDOT:PSS film to planarize the ITO, whose rough surface could otherwise result in shorts through the thin molecular film. Additionally, other preferred embodiments of the invention may include two EBLs, one situated between the ETL and the cathode, and the other situated between the anode and the HTL.

Representative embodiments may also comprise transparent charge transfer layers. As described herein charge transfer layers are distinguished from ETL and HTL layers by the fact that charge transfer layers are frequently, but not necessarily, inorganic and they are generally chosen not to be photoconductively active. The term "charge transfer layer" is used herein to refer to layers similar to but different from electrodes in that a charge transfer layer only delivers charge carriers from one subsection of an optoelectronic device to the adjacent subsection.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

The high bulk resistivities of organic photoconductors make it desirable to utilize relatively thin films of these materials. However, thin photosensitive layers will absorb a smaller fraction of incident radiation, and thus the external quantum efficiency of thin-layer photoconductors may be lower than that of thick-layer photoconductors. The external quantum efficiency of thin-layer organic devices such as those described herein can be further enhanced, however, by a suitable design of the device geometry. Due to the thin photoactive layers of the embodiments described so far, device geometries which provide a means for increasing the effective thickness of the absorbant layers may be preferable. One such configuration is a stacked device as described in U.S. Pat. Nos. 6,198,091, 6,198,092, and co-pending application Ser. No. 09/136,377, now U.S. Pat. No. 6,278,055, incorporated herein by reference. As used herein, the terms "stack", "stacked", "multisection" and "multicell" refer to any optoelectronic device with multiple layers of a photoconductive material separated by one or more electrode or charge transfer layers. When the term "subcell" is used hereafter, it refers to an organic photosensitive optoelectronic construction. When a subcell is used individually as a photosensitive optoelectronic device, it typically includes a complete set of electrodes, i.e., positive and negative. As disclosed herein, in some stacked configurations it is possible for adjacent subcells to utilize common, i.e., shared, electrode or charge transfer layers. In other cases, adjacent subcells do not share common electrodes or charge transfer layers. Thus, a subcell may encompass the subunit construction regardless of whether each subunit has its own distinct electrodes or shares electrodes or charge transfer layers with adjacent subunits. Herein the terms "cell", "subcell", "unit", "subunit", "section", and "subsection" are used interchangeably to refer a photoconductive layer or set of layers and the adjoining electrodes or charge transfer layers.

Since the stacked subcells of the solar cell may be fabricated using vacuum deposition techniques that allow external electrical connections to be made to the electrodes separating the subcells, each of the subcells in the device may be electrically connected either in parallel or in series, depending on whether the power and/or voltage generated by the solar cell is to be maximized. The improved external quantum efficiency that may be achieved for stacked solar cell embodiments of the present invention may also be attributed to the fact that the subcells of the stacked solar cell may be electrically connected in parallel since a parallel electrical configuration permits substantially higher fill factors to be realized than when the subcells are connected in series.

Although the high series resistance of photoconductive organic materials inhibits use of subcells in a series configuration for high power applications, there are certain applications, for example, in operating liquid crystal displays (LCD), for which a higher voltage may be required, but only at low current and, thus, at low power levels. For this type of application, stacked, series-connected solar cells may be suitable for providing the required voltage to the LCD. In the case when the solar cell is comprised of subcells electrically connected in series so as to produce such a higher voltage device, the stacked solar cell may be fabricated so as to have each subcell producing approximately the same current so to reduce inefficiency. For example, if the incident radiation passes through in only one direction, the stacked subcells may have an increasing thickness with the outermost subcell, which is most directly exposed to the incident radiation, being the thinnest. Alternatively, if the subcells are superposed on a reflective surface, the thicknesses of the individual subcells may be adjusted to account for the total combined radiation admitted to each subcell from the original and reflected directions.

Further, it may be desirable to have a direct current power supply capable of producing a number of different voltages. For this application, external connections to intervening electrodes could have great utility. Accordingly, in addition to being capable of providing the maximum voltage that is generated across the entire set of subcells, an exemplary embodiment the stacked solar cells of the present invention may also be used to provide multiple voltages from a single power source by tapping a selected voltage from a selected subset of subcells.

Alternatively, a concentrator configuration can be employed to increase the efficiency of the device, where photons are forced to make multiple passes through the thin absorbing region. Co-pending U.S. patent application Ser. No. 09/449,800 entitled "Highly Efficient Multiple Reflection Photosensitive Optoelectronic Device with Optical Concentrator" (hereinafter"'800 Application"), now U.S. Pat. No. 6,333,458, incorporated herein by reference, addresses this issue by using structural designs that enhance the photoconversion efficiency of photosensitive optoelectonic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the thin film of photoconductive material. The geometries disclosed in the '800 Application therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

The '800 application also discloses an aperture in either one of the reflecting surfaces or an external side face of the waveguiding device for coupling to an optical concentrator, such as a Winston collector, to increase the amount of electromagnetic radiation efficiently collected and delivered to the cavity containing the photoconductive material. Exemplary non-imaging concentrators include a conical concentrator, such as a truncated paraboloid, and a trough-shaped concentrator. With respect to the conical shape, the device collects radiation entering the circular entrance opening of diameter $d_1$ within $\pm\theta_{max}$ (the half angle of acceptance) and directs the radiation to the smaller exit opening of diameter $d_2$ with negligible losses and can approach the so-called thermodynamic limit. This limit is the maximum permissible concentration for a given angular field of view. Conical concentrators provide higher concentration ratios than trough-shaped concentrators but require diurnal solar tracking due to the smaller acceptance angle. (After *High Collection Nonimaging Optics* by W. T. Welford and R. Winston, (hereinafter "Welford and Winston") pp 172–175, Academic Press, 1989, incorporated herein by reference).

Several guidelines should be kept in mind in designing an efficient organic photosensitive optoelectronic device. It is desirable for the exciton diffusion length, $L_D$, to be greater than or comparable to the layer thickness, L, as it is believed that most exciton dissociation will occur at an interface. If $L_D$ is less than L, then many excitons may recombine before dissociation. It is further desirable for the total photoconductive material thickness to be of the order of the electromagnetic radiation absorption length, $1/\alpha$ (where $\alpha$ is the absorption coefficient), so that nearly all of the radiation incident on the solar cell is absorbed to produce excitons. However, the thickness should not be so large compared to the extent of the heterojunction electric fields that many excitons are generated in a field-free region. As the electric field helps to dissociate the excitons, if an exciton dissociates in a field-free region, it is more likely to suffer geminant recombination and contribute nothing to the photocurrent. Further, electric fields may exist at the electrode/semiconductor interfaces. These fields at the electrode interfaces can also promote exciton quenching. Furthermore, the photoconductive layer should be as thin as possible to avoid excess series resistance due to the high bulk resistivity of organic semiconductors.

On the other hand, another countervailing consideration is that as the separation between the exciton dissociating interface and the adjacent electrodes increases, the electric field region around the interface will have a higher value over a greater volume. As light absorption increases with increasing electric field strength, more excitons will be generated. Also, the higher electric fields will also promote faster exciton dissociation.

Devices have been constructed and example data recorded for exemplary embodiments of the present invention. The following examples of the invention are illustrative and not limiting of the invention.

EXAMPLES

Exemplary embodiments are fabricated on pre-cleaned glass substrates coated with a ~1400 Å thick transparent, conducting indium-tin-oxide (ITO) anode (with a sheet resistance of 40 Ω/sq.). After solvent cleaning, the substrates are treated with an $O_2$-plasma (50W, 100 mTorr, 5 minutes). Unless otherwise specified, the ITO film is then coated with a (320±10) Å thick film of PEDOT:PSS by spin coating from solution at 4000 rpm for 40 seconds, followed by drying at 90° C. for 15 minutes in vacuum. The organic materials can be obtained commercially, and then purified using thermal gradient sublimation. Films are grown at room temperature in high vacuum (~1×10$^{-6}$ Torr) in the following sequence: a 50 Å to 400 Å thick film of the donor-like copper phthalocyanine (CuPc), followed by a 100 Å to 400 Å thick film of the acceptor-like $C_{60}$. Next, a 50 Å to 400 Å thick bathocuproine (BCP) EBL is deposited. The cathode consists of Al, deposited by thermal evaporation through a shadow mask with 1 mm diameter circular openings. Power conversion efficiencies are measured under illumination from a solar simulator set to produce an AM1.5G (air mass 1.5, global) spectrum. The intensity is measured using a calibrated broadband optical power meter and is varied using neutral density filters. Quantum efficiencies are measured at ~400 Hz using monochromatic light of variable wavelength with a 50% duty cycle.

Figure 1:
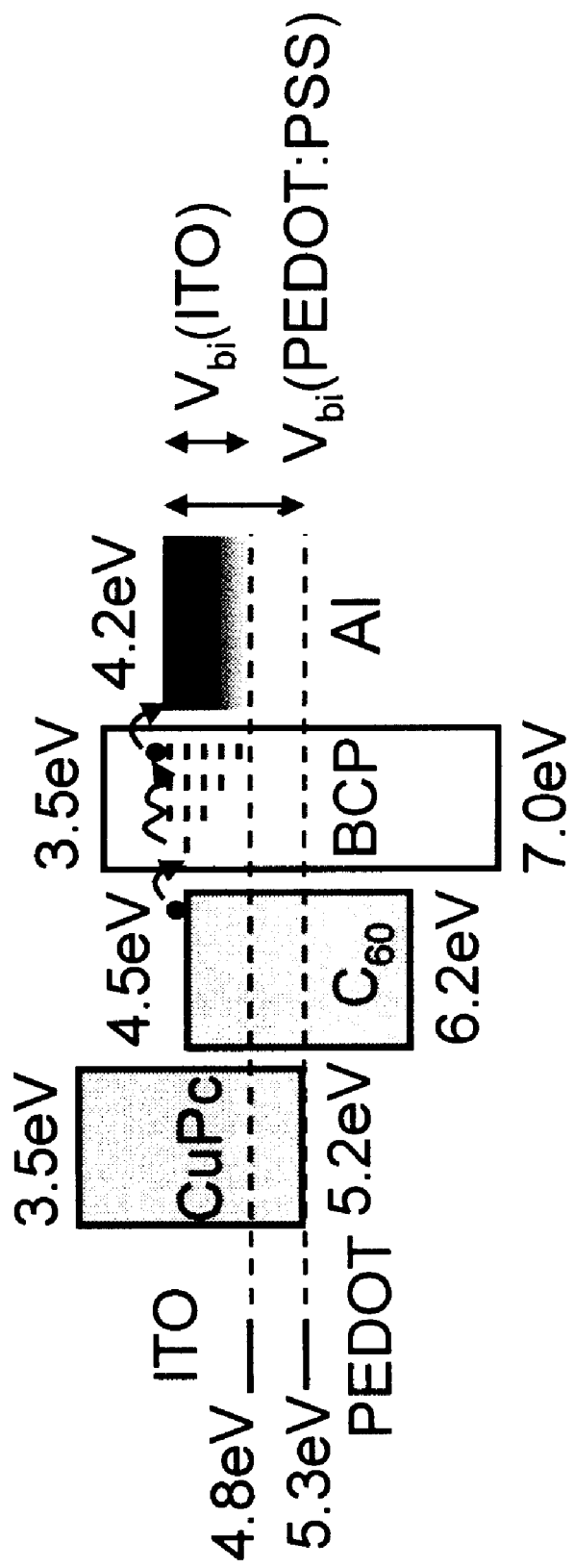
FIG. 1 illustrates the proposed energy diagram of the devices with ITO and PEDOT:PSS anodes. The Fermi level energies for the electrodes (ITO, PEDOT:PSS, and Al), and HOMO and LUMO levels for CuPc, $C_{60}$, and BCP are indicated. The ITO and PEDOT:PSS work function data are taken from T. M. Brown et al, *Appl. Phys. Lett.* 75, 1679 (1999). The $C_{60}$ ionization potential and electron affinity are taken from R. Mitsumoto et al. *J. Phys. Chem. A* 102, 552 (1998), and I. G. Hill et al., *J. Appl. Phys.* 86, 4515 (1999) was used for CuPc and BCP. The electrode work functions and HOMO levels were obtained by ultraviolet photoelectron spectroscopy, and have error bars of ±0.1 eV. The LUMO levels were estimated from the HOMO levels and the optical energy gap.
Figure 2:
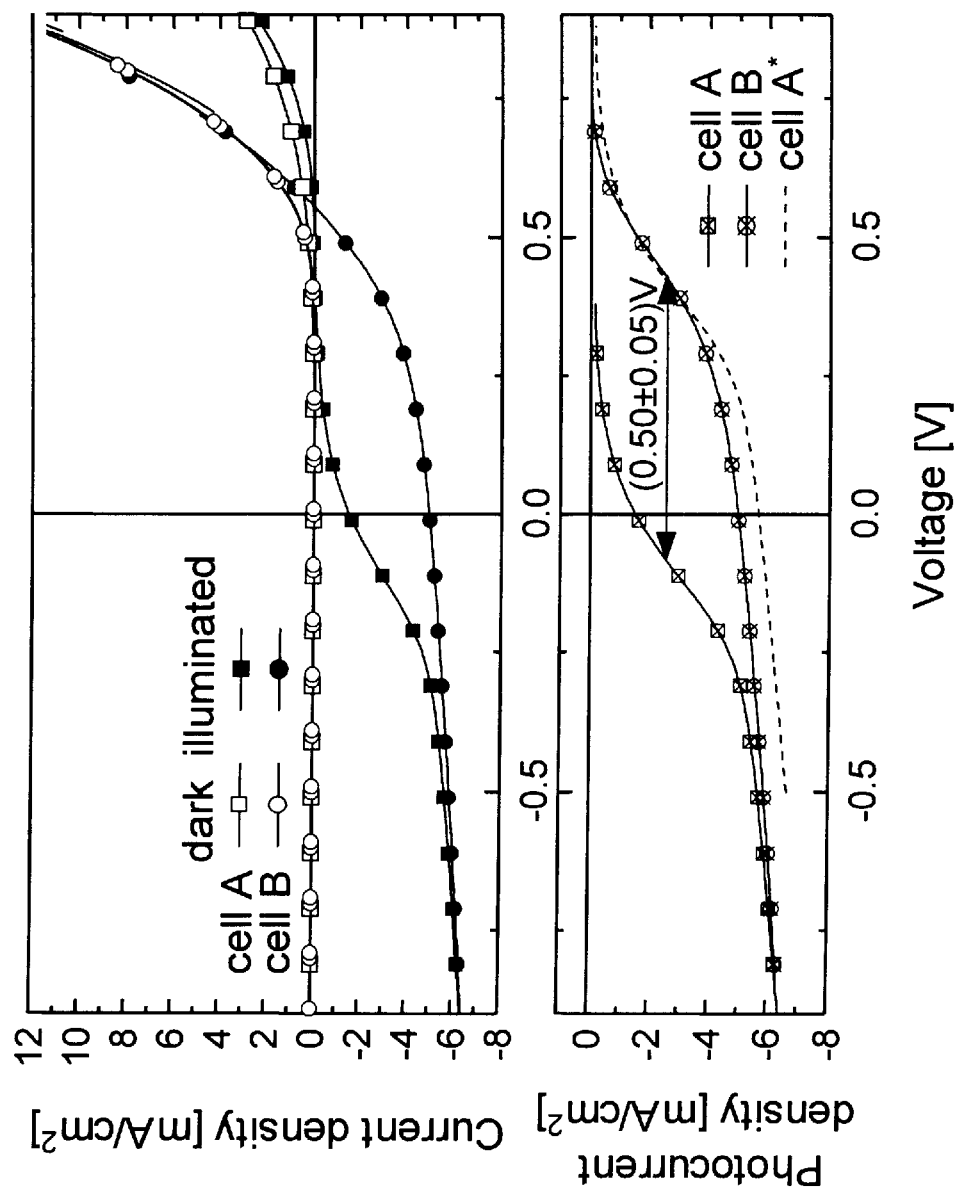
FIG. 2 (upper panel) shows the plot of current density vs. voltage for the devices anode/200 Å CuPc/200 Å $C_{60}$/105 Å

In FIG. 2 we compare the current-voltage (I–V, upper panel) and photocurrent-voltage (lower panel) characteristics in the dark (open symbols) and under solar illumination (filled symbols) of two cells with the structure anode/200 Å CuPc/200 Å $C_{60}$/150 Å BCP/800 Å Al grown simultaneously on different substrates. Cell A (squares) was grown on bare ITO, while for cell B (circles), the ITO was precoated with PEDOT:PSS. The introduction of the PEDOT:PSS layer leads to an increase in the dark current (open circles) under forward bias by a factor of ~10. In contrast, the reverse-biased dark current remains unchanged. Furthermore, the presence of the PEDOT:PSS also causes a shift of the photocurrent characteristics by a voltage $\Delta V = (0.50\pm0.05)V$, in agreement with recent electroabsorption studies on polymer light-emitting diodes with and without a PEDOT:PSS hole injection layer T. M. Brown et al., *Appl. Phys. Lett.* 75, 1679 (1999). These changes are explained by the higher work function of the PEDOT:PSS in comparison with that of ITO, moving the Fermi-level 0.50V closer to the CuPc highest occupied molecular orbital (HOMO). This results in improved current injection into the CuPc layer because of the smaller barrier to hole injection and hence an increased dark current under forward bias. This also increases the charge-separating built-in electrostatic potential ($V_{bi}$) by 0.50V (FIG. 1), leading to improved collection of the photogenerated carriers at higher positive voltages, and hence an increased power conversion efficiency.

FIG. 3 shows the effect of mild plasma treatment (10W, 30 s, 100 mTorr, 100 sccm Ar or $O_2$) of the PEDOT:PSS layer on the I–V characteristics of devices with the layer structure ITO/PEDOT:PSS/50 Å CuPc/200 Å $C_{60}$/100 Å BCP/800 Å Al under AM1.5G solar illumination with an intensity of 400 mW/cm$^2$ (4 suns). The fill-factor (ff) increases from 0.36 for untreated PEDOT:PSS, to 0.41 for $O_2$, and 0.49 for Ar treated PEDOT:PSS films. The treatment apparently modifies the surface electronic structure of the PEDOT:PSS layer, leading to improved carrier collection properties. We also note that the introduction of PEDOT:PSS in our PV cells leads to a fabrication yield close to 100% (i.e. no shorts were observed for >50 measured devices of varying thicknesses). We attribute this to the ability of the spin-coated PEDOT-:PSS film to planarize the ITO, whose rough surface would otherwise result in shorts through the thin molecular film.

The $C_{60}$ lowest unoccupied molecular orbital (LUMO) energy as estimated from the difference of the ionization potential and the optical energy gap, lies below that of BCP by $(1.0\pm0.2)$eV (FIG. 1). Despite the fact that the optical energy gap leads to only an indirect estimate of the position of the LUMO levels, the photogenerated electrons must nevertheless be transported from the $C_{60}$ LUMO, over the barrier formed by the BCP LUMO, into the cathode without incurring a substantial voltage drop or cell series resistance. This suggests that electron transport across the BCP mainly occurs through states below the LUMO induced during deposition of the metal cathode. Evidence for this is given in the inset of FIG. 2, which shows the short circuit current density ($J_{SC}$) of ITO/PEDOT:PSS/200 Å CuPc/400 Å $C_{60}$/BCP/Al devices as a function of the thickness of the BCP layer under AM1.5G illumination with an intensity of 100 mW/cm². The initial increase in $J_{SC}$ is due to an increase in absorption efficiency as the active layers are separated from the metallic cathode. $J_{SC}$ then rolls off exponentially with BCP thicknesses >150 Å. This suggests that defect states below the LUMO of BCP, induced by the thermalization of the hot metal atoms promote electron transport from the $C_{60}$ layer to the cathode. These states are generated over a distance of ~150 Å into the BCP with a density sufficient to extract carriers at a rate exceeding that of photocarrier generation.

In FIG. 4, we show the I–V characteristics of the optimized device structure: ITO/PEDOT:PSS(Ar treated)/200 Å CuPc/400 Å $C_{60}$/120 Å BCP/1000 Å Al, as a function of the incident optical power density. The external power conversion efficiency ($\eta_P$), open circuit voltage ($V_{OC}$) and FF of this device as functions of the incident optical power density are plotted in FIG. 5a. The conversion efficiency, $\eta_P$, reaches a maximum of $(3.7\pm0.2)$% at an incident power level of 44 mW/cm² (0.44 suns) and rolls off at higher illumination intensities because of the cell series resistance ($R_S$) of $(6.2\pm1.2)\Omega$-cm². At an illumination intensity of 150 mW/cm², $\eta_P=(3.6\pm0.2)$%, $J_{SC}=18.8$ mA/cm², $V_{OC}=0.58$V, and ff=0.52, while at 1200 mW/cm² illumination, $J_{SC}$ reaches a value as high as 138 mA/cm². The effect of the series resistance can be clearly seen in FIG. 4. At intensities >150 mW/cm², the maximum electrical output power is achieved at lower voltages, leading to lower values for ff, and hence $\eta_P$. In contrast to results for CuPc/PTCBI/BCP cells, no broad plateau of maximum power conversion efficiency is observed as a consequence of the higher power conversion efficiency which magnifies the effect of the series resistance. In FIG. 5b, the external quantum efficiency of this device and the solar spectral density are plotted as functions of wavelength. The photocurrent contribution of $C_{60}$ is generated between $\lambda=400$ nm and 550 nm, while the CuPc layer contributes from $\lambda=550$ nm to 750 nm, such that the solar spectrum at $\lambda<750$ nm is completely covered.

In summary, we have shown that the efficiency of organic solar cells employing an EBL can be significantly higher than conventional cells, depending on materials choice and processing parameters. In particular, the use of $C_{60}$ with its long exciton diffusion length, together with optimization of the contacts leads to external power conversion efficiencies of $(3.6\pm0.2)$% under AM1.5G solar illumination with an intensity of 150 mW/cm². We anticipate that additional improvements to these devices, such as the use of light trapping structures with these CuPc/$C_{60}$ double heterostructure cells will lead to power conversion efficiencies in excess of 5%. Thus, the present invention is directed to organic solar cells having an external power conversion efficiency of at least about 3.6%.

Thus, there has been described and illustrated herein an organic photosensitive optoelectronic device and method for producing the same. Those skilled in the art, however, will recognize that many modifications and variations besides those specifically mentioned may be made in the apparatus and techniques described herein without departing substantially from the concept of the present invention. Accordingly, it should be clearly understood that the form of the present invention as described herein is exemplary only and is not intended as a limitation on the scope of the present invention.

What is claimed is:

1. An organic photosensitive optoelectronic device comprising:
   an anode;
   a hole transport layer, the hole transport layer formed of a photoconductive organic semiconductor material;
   an electron transport layer over the hole transport layer, the electron transport layer comprising a fullerene;
   an exciton blocking layer; and
   a cathode,
   wherein the device is capable of an external power conversion efficiency of at least about 3.6%.

2. The device of claim 1, wherein the exciton blocking layer is situated between the electron transport layer and the cathode.

3. The device of claim 2, wherein the exciton blocking layer comprises BCP.

4. The device of claim 2, wherein the exciton blocking layer comprises $Alq_2$OPH.

5. The device of claim 1, further comprising a planarizing layer situated between the hole transport layer and the anode.

6. The device of claim 5, wherein the planarizing layer comprises PEDOT:PSS.

7. The device of claim 6, wherein the PEDOT:PSS has been treated with plasma.

8. The device of claim 1, wherein the fullerene is selected from the size range of $C_{60}$ to $C_{96}$.

9. The device of claim 1, wherein the fullerene is a nanotube.

10. The device of claim 1, wherein the anode is selected from transparent conducting oxides.

11. The device of claim 10, wherein the anode is ITO.

12. The device of claim 2, wherein:
   the electron transport layer is $C_{60}$,
   the hole transport layer is CuPc; and
   the exciton blocking layer is BCP.

13. The device of claim 1, wherein the electron transport layer, the hole transport layer, and the exciton blocking layer are disposed between two parallel planar reflective surfaces which form a waveguide.

14. The device of claim 13, having a transparent opening between the two reflective surfaces so that light is admitted to the device from a direction parallel to the planes of the reflective surfaces.

15. A stacked organic photosensitive optoelectronic device comprised of a plurality of photosensitive optoelectronic subcells, wherein at least one subcell includes an electron transporting layer comprising a fullerene, and wherein the device is capable of an external power conversion efficiency of at least about 3.6%.

16. The device of claim 15, wherein the at least one subcell additionally includes an exciton blocking layer and a hole transport layer adjacent the electron transport layer.

17. The device of claim 16, wherein the exciton blocking layer comprises BCP and is adjacent the electron transport layer.

18. The device of claim 16, wherein:

the electron transport layer is $C_{60}$, the hole transport layer is CuPc; and the exciton blocking layer is BCP.

19. A method for making an organic photosensitive optoelectronic device, the device comprising an anode, a hole transport layer, an electron transport layer comprising a fullerene, an exciton blocking layer and a cathode, wherein the device is capable of an external power conversion efficiency of at least about 3.6%, the method comprising the steps of:

(a) depositing the hole transport layer over the anode;

(b) depositing the electron transport layer over the hole transport layer;

(c) depositing the exciton blocking layer over the electron transport layer; and (d) depositing the cathode over the exciton blocking layer.

* * * * *

UNITED STATES PATENT AND TRADEMARK OFFICE
CERTIFICATE OF CORRECTION

PATENT NO.    : 6,580,027 B2
DATED         : June 17, 2003
INVENTOR(S)   : Forrest et al.

It is certified that error appears in the above-identified patent and that said Letters Patent is hereby corrected as shown below:

<u>Column 9,</u>
Line 11, change "polystyrenesuffonate" to -- polystyrenesulfonate --.

Signed and Sealed this

Thirtieth Day of March, 2004

JON W. DUDAS
*Acting Director of the United States Patent and Trademark Office*